United States Patent
Li et al.

(10) Patent No.: US 8,633,767 B2
(45) Date of Patent: Jan. 21, 2014

(54) AMPLIFIER CIRCUIT WITH NOISE SUPPRESSION AND RELATED NOISE SUPPRESSION METHOD THEREOF

(75) Inventors: Chin-Fu Li, Changhua County (TW); Guan-Hong Ke, Changhua County (TW); Shih-Chieh Chou, New Taipei (TW); Po-Chiun Huang, Hsinchu (TW)

(73) Assignees: Mediatek Inc., Science-Based Industrial Park, Hsin-Chu (TW); National Tsing Hua University, Hsinchu (TW)

( * ) Notice: Subject to any disclaimer, the term of this patent is extended or adjusted under 35 U.S.C. 154(b) by 93 days.

(21) Appl. No.: 13/220,650

(22) Filed: Aug. 29, 2011

(65) Prior Publication Data

US 2013/0049866 A1   Feb. 28, 2013

(51) Int. Cl.
*H03G 3/20* (2006.01)
*H03F 1/14* (2006.01)

(52) U.S. Cl.
USPC .............................................. 330/136; 330/51

(58) Field of Classification Search
USPC .................................... 330/51, 136, 149, 144
See application file for complete search history.

(56) References Cited

U.S. PATENT DOCUMENTS 6,459,337 B1 * 10/2002 Goren et al. ................... 330/43
2003/0161488 A1 * 8/2003 Nishiyama ................. 381/94.5

OTHER PUBLICATIONS

Bruccoleri, "Wide-Band CMOS Low-Noise Amplifier Exploiting Thermal Noise Canceling", pp. 275-282, IEEE Journal of Solid-State Circuits, vol. 39, No. 2, Feb. 2004.

* cited by examiner

*Primary Examiner* — Robert Pascal
*Assistant Examiner* — Khiem Nguyen
(74) *Attorney, Agent, or Firm* — Winston Hsu; Scott Margo

(57) ABSTRACT

An amplifier circuit includes an amplifier and a noise suppression block. The amplifier is arranged for receiving an input signal at an input port and generating an output signal at an output port according to the input signal. The noise suppression block is coupled between the input port and the output port of the amplifier, and arranged for receiving the input signal and the output signal and applying noise suppression to the output signal generated from the amplifier according to the received input signal and the received output signal.

18 Claims, 5 Drawing Sheets

AMPLIFIER CIRCUIT WITH NOISE SUPPRESSION AND RELATED NOISE SUPPRESSION METHOD THEREOF

BACKGROUND

The disclosed embodiments of the present invention relate to noise suppression, and more particularly, to an amplifier circuit with noise suppression and related noise suppression method thereof.

In communication systems, transmitter and receiver transfer information to and from a communication medium (e.g., air). The receiver side presents challenges, which are not present or are greatly relaxed in the transmitter side. This is mainly due to the hostile nature of the communication channel, which may result in a minimum detectable signal at the receiver input. The receiver must be able to handle such a weak wanted signal in order to guarantee a reliable quality of the information transmission. The ability of the receiver to detect a weak wanted signal is fundamentally limited by the unwanted noise present at its input. Since the unwanted noise is the fundamental obstacle to the reception of the weak wanted signal, low-noise techniques are crucial for the receiver design.

Specifically, regarding the amplifiers implemented in the receiver, the noise suppression technique is needed to reduce the unwanted noise present in the amplifier output. However, the conventional amplifier generally has design tradeoffs, such as gain, noise figure, impedance matching, power, and linearity. Thus, there is a need for an innovative power-effective noise suppression design that can achieve guaranteed noise improvement with less influence on gain and linearity of the amplifier.

SUMMARY

In accordance with exemplary embodiments of the present invention, an amplifier circuit with noise suppression and related noise suppression method thereof are proposed to solve the above-mentioned problem.

According to a first aspect of the present invention, an exemplary amplifier circuit is disclosed. The exemplary amplifier circuit includes an amplifier and a noise suppression block. The amplifier is arranged for receiving an input signal at an input port and generating an output signal at an output port according to the input signal. The noise suppression block is coupled between the input port and the output port of the amplifier, and arranged for receiving the input signal and the output signal and applying noise suppression to the output signal generated from the amplifier according to the received input signal and the received output signal.

According to a first aspect of the present invention, an exemplary noise suppression method for an amplifier is disclosed. The exemplary noise suppression method includes: receiving an input signal fed into an input port of the amplifier; receiving an output signal that is generated from an output port of the amplifier according to the input signal; and applying noise suppression to the output signal generated from the amplifier according to the received input signal and the received output signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "coupled" is intended to mean either an indirect or direct electrical connection. Accordingly, if one device is electrically connected to another device, that connection may be through a direct electrical connection, or through an indirect electrical connection via other devices and connections.

Figure 1:
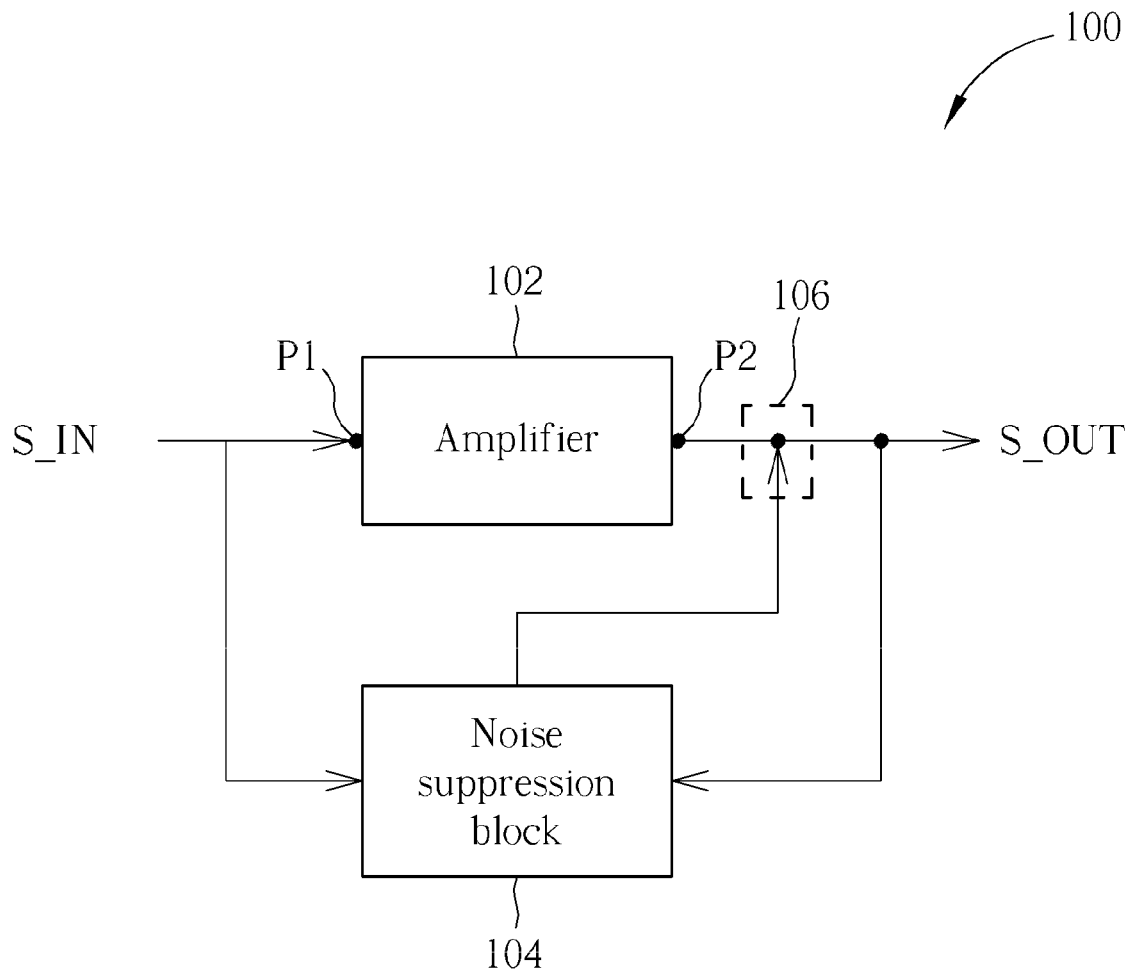
FIG. 1 is a block diagram illustrating a generalized amplifier circuit according to an exemplary embodiment of the present invention.

Please refer to FIG. 1, which is a block diagram illustrating a generalized amplifier circuit according to an exemplary embodiment of the present invention. The amplifier circuit 100 includes an amplifier 102 and a noise suppression block 104. The amplifier 102 is arranged for receiving an input signal S_IN at an input port P1, and generating an output signal S_OUT at an output port P2 according to the input signal S_IN. As shown in FIG. 1, the noise suppression block 104 is coupled between the input port P1 and the output port P2 of the amplifier 102. Therefore, the noise suppression block 104 is arranged for receiving the input signal S_IN and the output signal S_OUT, and applying noise suppression to the output signal S_OUT generated from the amplifier 102 according to the received input signal S_IN and the received output signal S_OUT. More specifically, an output of the noise suppression block 104 is generated to an interconnection 106 which may serve as a combining unit (e.g., an adder) for combining outputs of the amplifier 102 and the noise suppression block 104. As the input signal S_IN has at least an original wanted signal component, and the output signal S_OUT has an amplified wanted signal component and an unwanted noise component, the noise suppression block 104 is capable of extracting the unwanted noise component by referring to the received input signal S_IN and the output signal S_OUT, and providing the needed noise suppression according to the extracted unwanted noise component. Thus, the amplifier 102 may be designed to have the desired gain and linearity at the expense of the noise performance, and the noise performance of the amplifier 102 may be improved with the help of the accompanying noise suppression block 104 which has negligible or no influence on the gain and linearity of the amplifier 102. Further details of the proposed noise suppression technique are described as below.

Figure 2:
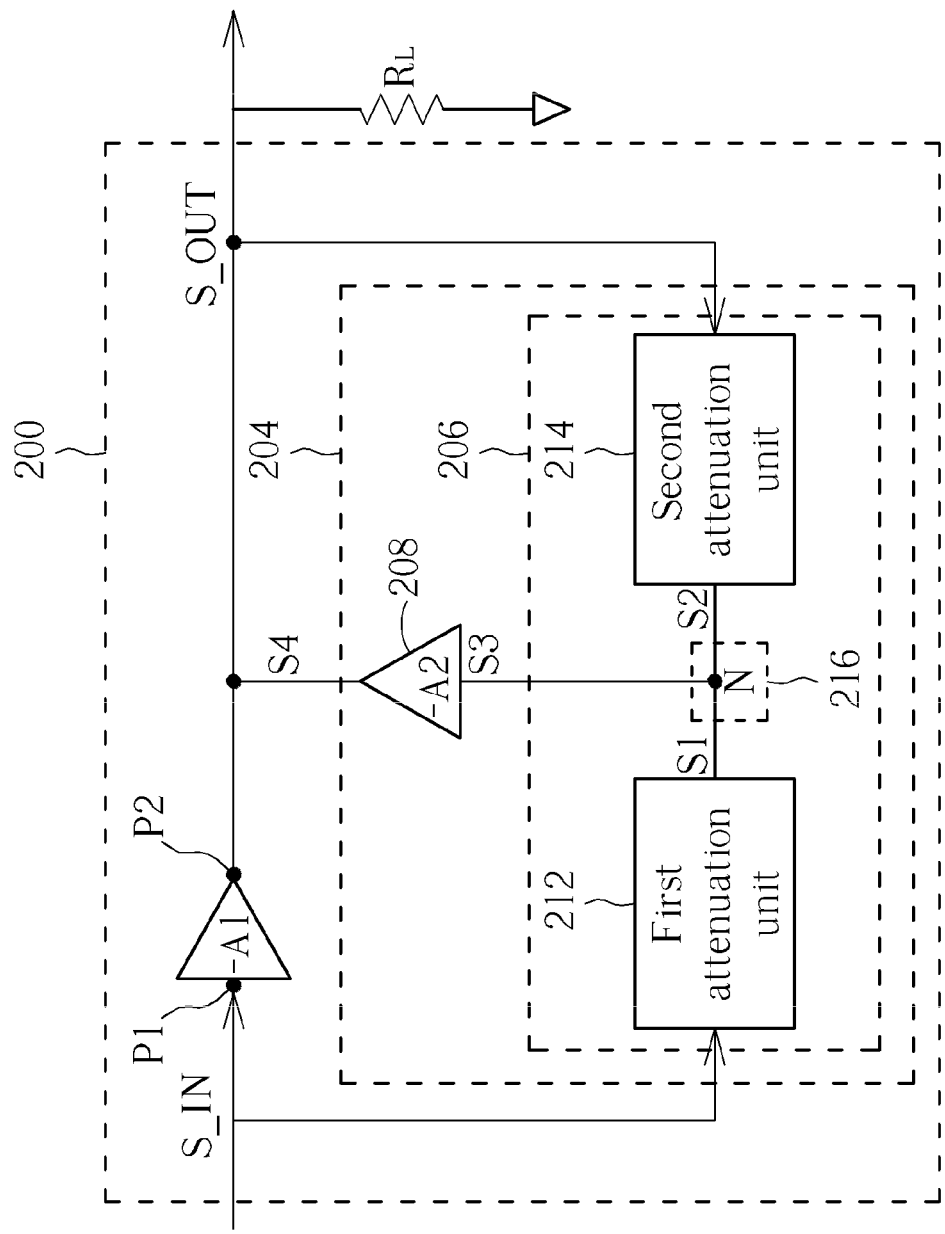
FIG. 2 is a diagram illustrating an exemplary implementation of an amplifier circuit according to the present invention.

FIG. 2 is a diagram illustrating an exemplary implementation of an amplifier circuit according to the present invention. The implementation of the amplifier circuit is based on the circuit structure shown in FIG. 1. Therefore, the exemplary amplifier circuit 200 includes an amplifier 202 and a noise suppression block 204. The amplifier 202 generates an output signal S_OUT at its output port P2 according an input signal S_IN received at its input port P1, wherein the output signal S_OUT is delivered to a following stage represented by a load resistor $R_L$. The noise suppression block 204 includes a combining circuit 206 and an output circuit 208. In this exemplary embodiment, the combining circuit 206 is arranged for generating a combined signal S3 by combining signals S1 and S2 respectively derived from the received input signal S_IN and the received output signal S_OUT. The output circuit 208 is coupled between the combining circuit 206 and the output port P2 of the amplifier 202, and arranged for generating a noise suppression signal S4 according to the combined signal S3, and applying noise suppression to the output signal S_OUT by adding the noise suppression signal S4 to the output signal S_OUT. As the amplifier 202 has a negative gain $-A1$, the wanted signal component included in the input signal S_IN and the wanted signal component included in the output signal S_OUT would have opposite signs. To put it another way, the wanted signal component included in the input signal S_IN and the wanted signal component included in the output signal S_OUT are out of phase. Thus, with a proper design of the combining circuit 206, the unwanted noise component may be extracted to determine the noise suppression signal S4 applied to the output signal S_OUT. Specifically, a wanted signal component included in each of the received input signal S_IN and the received output signal S_OUT is stronger than a wanted signal component existing in the combined signal S3. In this way, as the wanted signal component is reduced, the combined signal S3 is almost composed of the unwanted noise component. That is, the combined signal S3 may be regarded as a signal-attenuated and noise-extracted signal. In a preferred embodiment, the combined signal may be a signal-nulled and noise-extracted signal (i.e., the combined signal S3 preferably includes no wanted signal component).

As shown in FIG. 2, the output circuit 208 has a negative gain $-A2$. Thus, the extracted unwanted noise component would be subtracted from the output signal S_OUT generated from the amplifier 202, thereby suppressing the noise component present in the output signal S_OUT. Ideally, with a proper design of the noise suppression block 206, the noise component present in the output signal S_OUT may be completely cancelled by the noise suppression signal S4.

To obtain the combined signal S3 (e.g., a signal-attenuated and noise-extracted signal or a signal-nulled and noise-extracted signal), the combining circuit 206 may be realized by a combination of a first attenuation unit 212, a second attenuation unit 214, and a combining unit 216, as shown in FIG. 2. The first attenuation unit 212 is arranged for attenuating the received input signal S_IN by a first attenuation factor $\beta1$ and accordingly generating a first attenuated signal 51. The second attenuation unit 214 is arranged for attenuating the received output signal S_OUT by a second attenuation factor $\beta2$ and accordingly generating a second attenuated signal S2. For example, each of the first attenuation unit 212 and the second attenuation unit 214 may be simply implemented by a passive element, such as a capacitive element, an inductive element, or a resistive element.

The combining unit 216 is simply realized by an interconnection N of the first attenuation unit 212 and the second attenuation unit 214. In other words, the combining unit 216 is coupled to the first attenuation unit 121 and the second attenuation unit 214, and arranged for combining the first attenuated signal S1 and the second attenuated signal S2 and accordingly generating the combined signal S3. By way of example, the first attenuation factor $\beta1$ and the second attenuation factor $\beta2$ may be configured by referring to the gain value of the amplifier 202. As the wanted signal component included in the input signal S_IN and the wanted signal component included in the output signal S_OUT have opposite signs due to the negative gain $-A1$ of the amplifier 202, the wanted signal component present at the interconnection N between the first attenuation unit 121 and the second attenuation unit 214 may be reduced/nulled by making the second attenuation factor $\beta2$ greater than the first attenuation factor $\beta1$. For example, $\beta2$ may be set by $\beta1 \times A1$.

Figure 3:
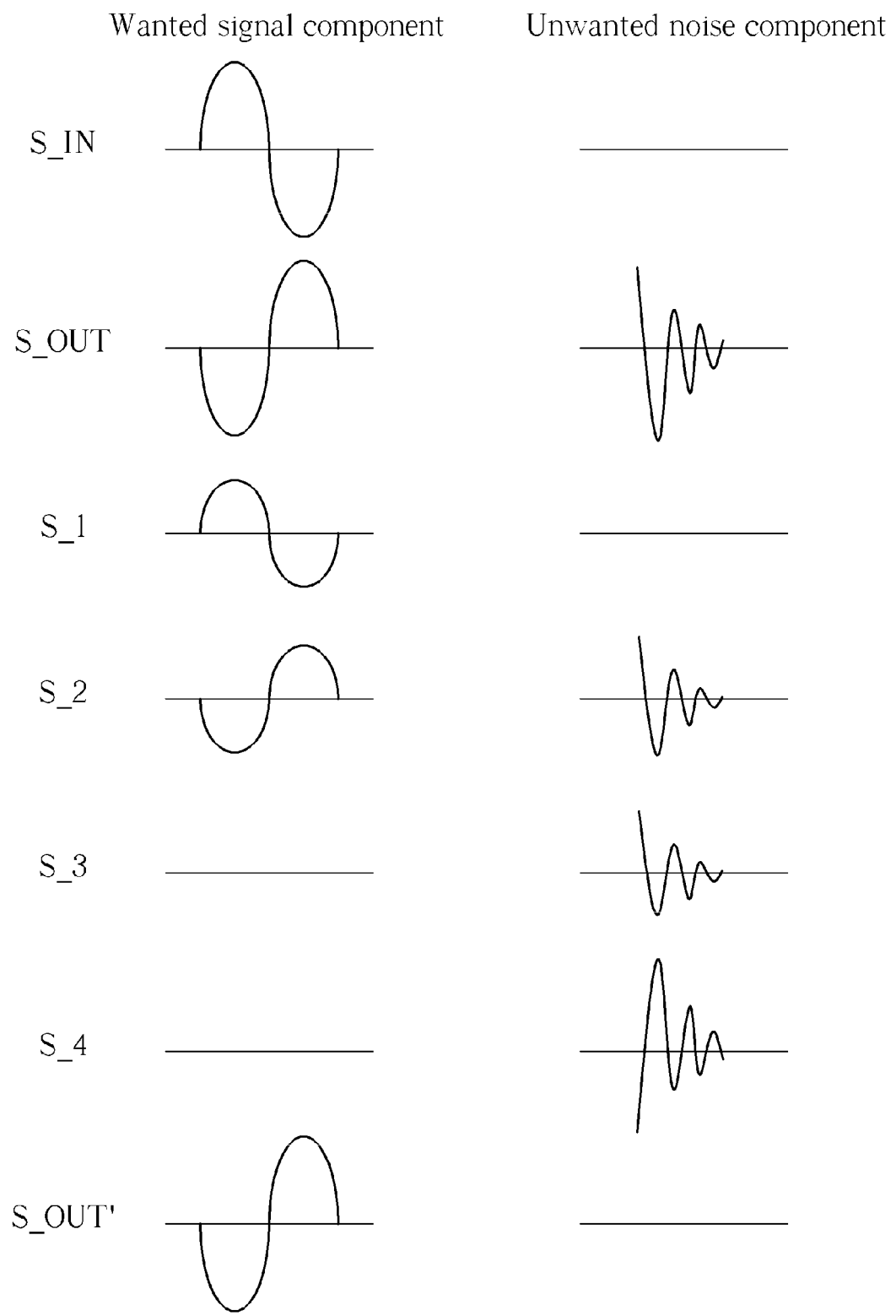
FIG. 3 is a waveform diagram illustrating wanted signal components and unwanted noise components of signals present in the amplifier circuit shown in FIG. 2.

Please refer to FIG. 3, which is a waveform diagram illustrating wanted signal components and unwanted noise components of signals present in the amplifier circuit 200 shown in FIG. 2. For simplicity and clarity, the input signal S_IN shown in FIG. 3 has no unwanted noise component. With a proper setting of the first attenuation factor $\beta1$ and the second attenuation factor $\beta2$, the first attenuated signal S1 has an attenuated signal component when compared with the received input signal S_IN, and the second attenuated signal S2 has an attenuated signal component and an attenuated noise component such that the attenuated signal component of the second attenuated signal S2 reduces or cancels the attenuated signal component of the first attenuated signal S1. In this example shown in FIG. 3, the attenuated signal components of the first attenuated signal S1 and the second attenuated signal S2 have the same intensity but opposite signs, resulting in cancellation of the wanted signal component. Thus, as shown in FIG. 3, only the attenuated unwanted noise component remains in the combined signal S3. As the output circuit 208 is configured to have a negative gain $-A2$, the attenuated unwanted noise component in the combined signal S3 is amplified. More specifically, the negative gain value of the output circuit 208 is capable of adjusting the actual noise suppression applied to the output signal S_OUT. In the example shown in FIG. 3, the amplified unwanted noise component in the noise suppression signal S4 and the original unwanted noise component in the output signal S_OUT have the same intensity but opposite signs, resulting in a noise-cancelled output signal S_OUT' which contains the wanted signal component only.

As mentioned above, the input signal S_IN shown in FIG. 3 has no unwanted noise component. However, this is for illustrative purposes only, and is not meant to be a limitation of the present invention. Due to the actual amplifier structure employed by the amplifier 102, it is possible that the noise component introduced by the amplifier 102 and present in the output signal S_OUT is fed back to the input port P1 of the amplifier 102. For example, the feedback noise component present in the input signal S_IN and the original noise component present in the output signal S_OUT may have the same sign (i.e., the noise component present in the input signal S_IN and the noise component present in the output signal S_OUT are in phase). In a case where the input signal S_IN has wanted signal component as well as unwanted noise component, the extracted noise component in the combined signal S3 may have higher intensity. However, the same objective of obtaining a signal-reduced and noise-extracted signal or a signal-nulled and noise-extracted signal is achieved through the use of the proposed noise suppression block 204. To put it simply, the example shown in FIG. 3 is for illustrative purposes only, and is not meant to be a limitation of the present invention. The spirit of the present invention is obeyed as long as the noise component present in the output signal S_OUT is reduced by means of the proposed noise suppression technique.

As shown in FIG. 2, the amplifier circuit 200 may have a single-ended topology. However, in an alternative design, the proposed noise suppression technique may also be applied to an amplifier circuit with a differential topology. That is, the amplifier of the amplifier circuit may be a single-ended amplifier or a differential amplifier, depending upon the actual design requirement/consideration. Besides, the aforementioned amplifier 102/202 may be any amplifier implemented in a wireless communication apparatus. For example, the amplifier 102/202 may be a radio-frequency (RF) low-noise amplifier (LNA) or a baseband amplifier (e.g., a baseband variable gain amplifier).

Figure 4:
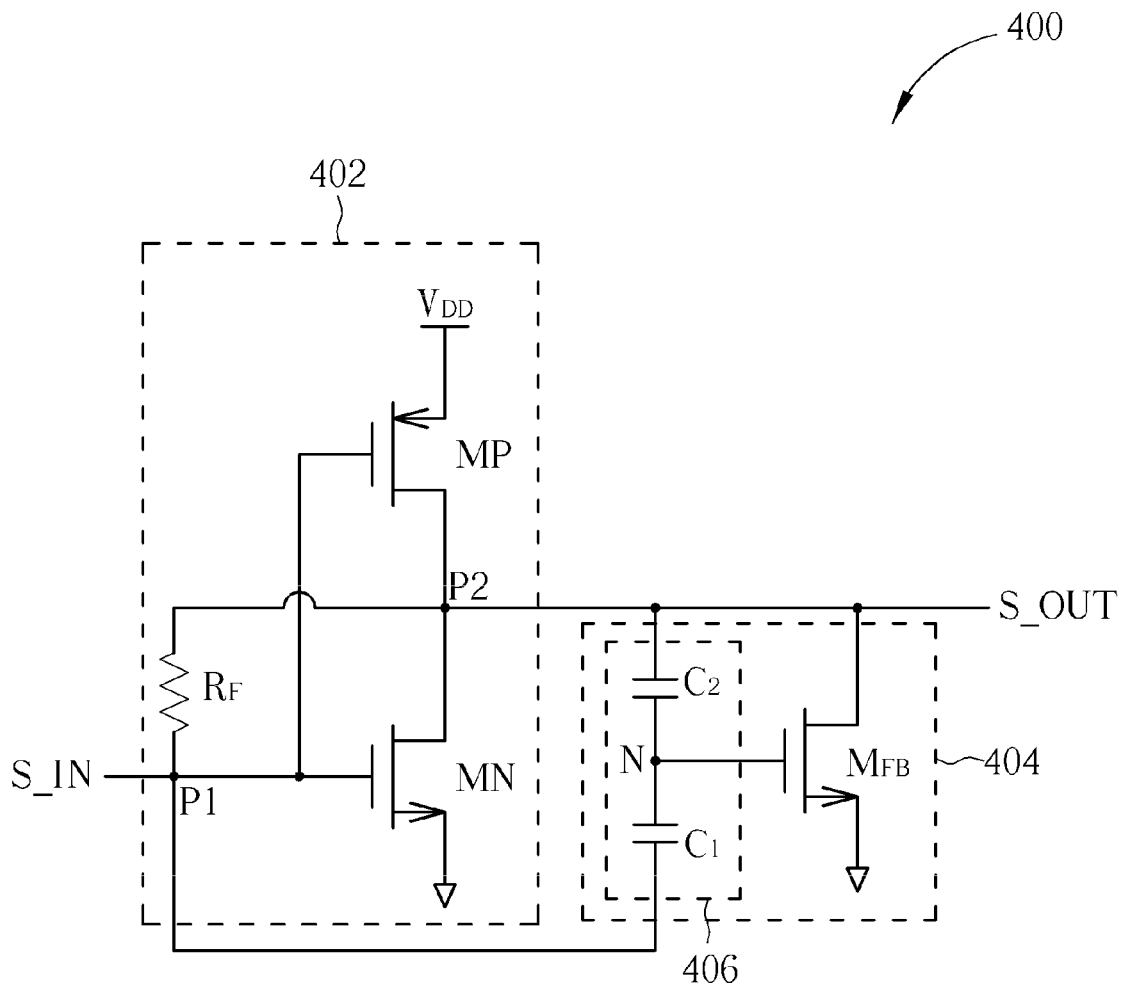
FIG. 4 is a circuit diagram of a first exemplary amplifier circuit according to the present invention.

Please refer to FIG. 4, which is a circuit diagram of a first exemplary amplifier circuit according to the present invention. The exemplary amplifier circuit 400 employs an amplifier structure based on the amplifier structure shown in FIG. 1/FIG. 2, and therefore includes a single-ended RF LNA 402 and a noise suppression block 404. The single-ended RF LNA 402 includes a plurality of transistors MP and MN coupled between reference voltages $V_{DD}$ and GND, and a feedback resistor $R_F$ coupled between an input port P1 and an output port P2. As a person skilled in the art can readily understand the operation of the single-ended RF LNA 402, further description is omitted here for brevity. In this exemplary implementation, the noise suppression block 404 includes an output circuit realized by a transistor $M_{FB}$ and a combining circuit 406 realized by capacitors $C_1$ and $C_2$ and an interconnection N between the capacitors $C_1$ and $C_2$. As a person skilled in the art can readily understand the operation of the noise suppression block 404 after reading above paragraphs directed to the amplifier circuits shown in FIG. 1 and FIG. 2, further description is omitted here for brevity.

Figure 5:
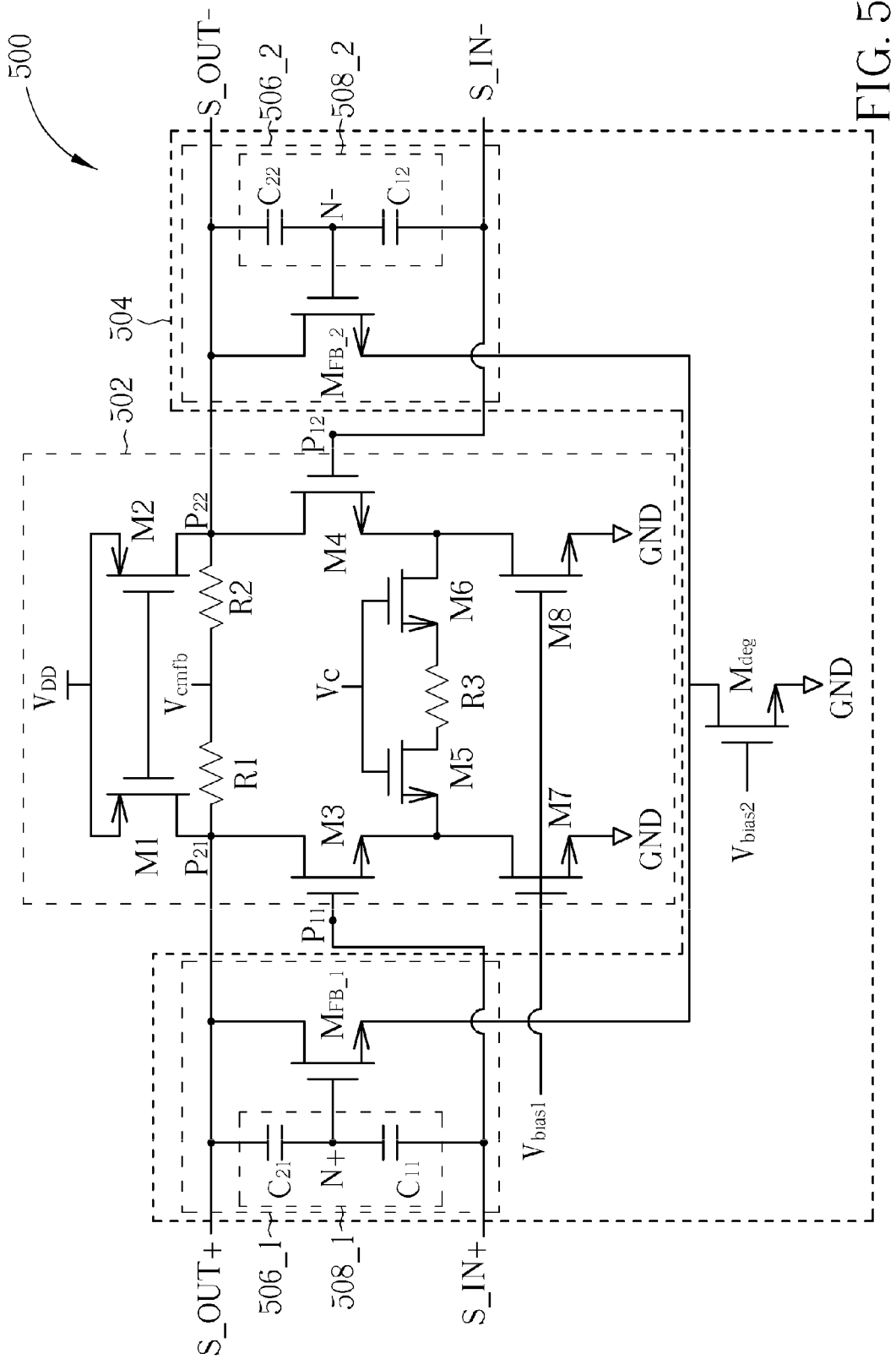
FIG. 5 is a circuit diagram of a second exemplary amplifier circuit according to the present invention.

Please refer to FIG. 5, which is a circuit diagram of a second exemplary amplifier circuit according to the present invention. The exemplary amplifier circuit 500 employs an amplifier structure based on the amplifier structure shown in FIG. 1/FIG. 2, and therefore includes a differential baseband amplifier 502 and a noise suppression module 504. The differential baseband amplifier 502 has an input port including a positive input node $P_{11}$ and a negative input node P12 used for receiving an input signal which is a differential signal pair including a positive input S_IN+ and a negative input S_IN−; besides, the differential baseband amplifier 502 also has an output port including a positive output node $P_{21}$ and a negative output node $P_{22}$ used for receiving an output signal which is a differential signal pair including a positive output S_OUT+ and a negative output S_OUT−. As shown in the figure, the differential baseband amplifier 502 includes a plurality of transistors M1-M8 and a plurality of resistors R1-R3, wherein the transistors M5 and M6 are controlled by a control voltage $V_c$, the transistors M7 and M8 are biased by a bias voltage $V_{BIAS1}$, and the transistors M1 and M2 are controlled by a common-mode feedback voltage $V_{CMFB}$. As a person skilled in the art can readily understand the operation of the differential baseband amplifier 502, further description is omitted here for brevity.

In this exemplary implementation, the noise suppression module 504 includes a plurality of noise suppression blocks 506_1 and 506_2, and an optional degeneration resistor realized by a transistor $M_{deg}$ biased by a bias voltage $V_{bias2}$. As shown in the figure, the noise suppression block 506_1 includes an output circuit realized by a transistor $M_{FB\_1}$, and a combining circuit 508_1 realized by capacitors $C_{11}$ and $C_{21}$ and an interconnection N+ between the capacitors $C_{11}$ and $C_{21}$, and the noise suppression block 506_2 includes an output circuit realized by a transistor $M_{FB\_2}$, and a combining circuit 508_2 realized by capacitors $C_{12}$ and $C_{22}$ and an interconnection N− between the capacitors $C_{12}$ and $C_{22}$. As a person skilled in the art can readily understand the operation of each of the noise suppression blocks 506_1 and 506_2 after reading above paragraphs directed to the amplifier circuits shown in FIG. 1 and FIG. 2, further description is omitted here for brevity.

Briefly summarized, the noise suppression method employed by an amplifier circuit may include the following steps: receiving an input signal fed into an input port of the amplifier; receiving an output signal that is generated from an output port of the amplifier according to the input signal; and applying noise suppression to the output signal generated from the amplifier according to the received input signal and the received output signal. As the details of each step can be readily known from above paragraphs directed to the amplifier circuits shown in FIG. 1 and FIG. 2, further description is omitted here for brevity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An amplifier circuit, comprising:
   an amplifier, arranged for receiving an input signal at an input port and generating an output signal at an output port according to the input signal; and
   a noise suppression block, coupled between the input port and the output port of the amplifier, the noise suppression block arranged for receiving the input signal and the output signal and applying noise suppression to the output signal generated from the amplifier according to the received input signal and the received output signal;
   wherein the noise suppression block comprises:
      a combining circuit, comprising:
         a first attenuation unit, arranged for attenuating the received input signal and accordingly generating a first attenuated signal;
         a second attenuation unit, arranged for attenuating the received output signal and accordingly generating a second attenuated signal; and
         a combining unit, coupled to the first attenuation unit and the second attenuation unit, the combining unit arranged for combining the first attenuated signal and the second attenuated signal, and accordingly generating a combined signal; and
      an output circuit, coupled between the combining circuit and the output port of the amplifier, the output circuit arranged for generating a noise suppression signal according to the combined signal and applying noise suppression to the output signal by adding the noise suppression signal to the output signal.

2. The amplifier circuit of claim 1, wherein a wanted signal component included in each of the received input signal and the received output signal is stronger than a wanted signal component existing in the combined signal.

3. The amplifier circuit of claim 1, wherein the combined signal is a signal-nulled and noise-extracted signal.

4. The amplifier circuit of claim 1, wherein each of the first attenuation unit and the second attenuation unit is a passive element.

5. The amplifier circuit of claim 1, wherein the output circuit has a negative gain.

6. The amplifier circuit of claim 1, wherein the amplifier is a radio-frequency (RF) low-noise amplifier (LNA).

7. The amplifier circuit of claim 1, wherein the amplifier is a baseband amplifier.

8. The amplifier circuit of claim 1, wherein the amplifier is a single-ended amplifier.

9. The amplifier circuit of claim 1, wherein the amplifier is a differential amplifier.

10. A noise suppression method for an amplifier, comprising:
   receiving an input signal fed into an input port of the amplifier;
   receiving an output signal that is generated from an output port of the amplifier according to the input signal; and
   applying noise suppression to the output signal generated from the amplifier according to the received input signal and the received output signal;
   wherein the step of applying noise suppression to the output signal generated from the amplifier comprises:
      generating a first attenuated signal by attenuating the received input signal;
      generating a second attenuated signal by attenuating the output signal;
      generating a combined signal by combining the first attenuated signal and the second attenuated signal;
      generating a noise suppression signal according to the combined signal; and
      applying noise suppression to the output signal by adding the noise suppression signal to the output signal.

11. The noise suppression method of claim 10, wherein the amplifier is a baseband amplifier.

12. The noise suppression method of claim 10, wherein the amplifier is a single-ended amplifier.

13. The noise suppression method of claim 10, wherein the amplifier is a differential amplifier.

14. The noise suppression method of claim 10, wherein the amplifier is a radio-frequency (RF) low-noise amplifier (LNA).

15. The noise suppression method of claim 10, wherein a wanted signal component included in each of the received input signal and the received output signal is stronger than a wanted signal component existing in the combined signal.

16. The noise suppression method of claim 10, wherein the combined signal is a signal-nulled and noise-extracted signal.

17. The noise suppression method of claim 10, wherein the step of generating the first attenuated signal comprises utilizing a passive element to attenuate the received input signal; and the step of generating the second attenuated signal comprises utilizing a passive element to attenuate the output signal.

18. The noise suppression method of claim 10, wherein the step of generating the noise suppression signal comprises:
   generating the noise suppression signal by applying a negative gain to the combined signal.

* * * * *